United States Patent
Pehlke (10) Patent No.: US 9,859,850 B2
(45) Date of Patent: Jan. 2, 2018

(54) BOOST CONVERTER HAVING A BUCK SUPPLY VOLTAGE INPUT

(71) Applicant: SKYWORKS SOLUTIONS, INC., Woburn, MA (US)

(72) Inventor: David Richard Pehlke, Westlake Village, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/043,369

(22) Filed: Feb. 12, 2016

(65) Prior Publication Data

US 2016/0241138 A1    Aug. 18, 2016

Related U.S. Application Data

(60) Provisional application No. 62/116,454, filed on Feb. 15, 2015.

(51) Int. Cl.
| H03F 3/04 | (2006.01) |
| H03F 1/34 | (2006.01) |
| H03F 3/21 | (2006.01) |
| H03F 3/19 | (2006.01) |
| H02M 3/156 | (2006.01) |
| H03F 1/02 | (2006.01) |
| H03F 3/24 | (2006.01) |
| H02M 1/00 | (2006.01) |

(52) U.S. Cl.
CPC .............. *H03F 1/34* (2013.01); *H02M 3/156* (2013.01); *H03F 1/0211* (2013.01); *H03F 1/0261* (2013.01); *H03F 3/19* (2013.01); *H03F 3/211* (2013.01); *H03F 3/245* (2013.01); *H02M 2001/007* (2013.01); *H02M 2001/008* (2013.01); *H03F 2203/21131* (2013.01); *H03F 2203/21196* (2013.01)

(58) Field of Classification Search
CPC ............................ H03F 1/0227; H03F 1/0238
USPC ......................................... 330/127, 297, 282
See application file for complete search history.

(56) References Cited

U.S. PATENT DOCUMENTS

| 2008/0111631 A1* | 5/2008 | Shiikuma | .................. H03F 1/25 330/297 |
| 2013/0093514 A1* | 4/2013 | Xu | ...................... H02M 3/1582 330/129 |

* cited by examiner

*Primary Examiner* — Steven J Mottola
(74) *Attorney, Agent, or Firm* — Chang & Hale LLP (57) ABSTRACT

According to some implementations, a voltage supply system includes a boost converter including a bypass core. The voltage supply system also includes a buck converter configured to receive an input voltage and generate a buck voltage. The voltage supply system further includes a routing circuit configured to provide the buck voltage as an input to the boost converter.

18 Claims, 8 Drawing Sheets

BOOST CONVERTER HAVING A BUCK SUPPLY VOLTAGE INPUT

CROSS-REFERENCE TO RELATED APPLICATION(S)

This application claims priority to U.S. Provisional Application No. 62/116,454 filed Feb. 15, 2015, entitled BOOST CONVERTER HAVING A BUCK SUPPLY VOLTAGE INPUT. The contents of each of the above-referenced application(s) are hereby expressly incorporated by reference herein in their entireties for all purposes.

BACKGROUND

Field

The present disclosure generally relates to voltage supply systems.

Description of the Related Art

Many circuits in portable devices such as wireless devices require or utilize DC/DC power conversion to efficiently utilize limited battery supply resources. Often, voltages that exceed a battery voltage are needed or desired, while in other situations, voltages that are less than the battery voltage are utilized. Circuits, devices, components, and/or modules may be used to convert a battery voltage to a desired voltage (e.g., to a higher voltage or a lower voltage).

SUMMARY

In some implementations, the present disclosure relates to a voltage supply system. The voltage supply system includes a boost converter including a bypass core. The voltage supply system also includes a buck converter configured to receive an input voltage and generate a buck voltage. The voltage supply system further includes a routing circuit configured to provide the buck voltage as an input to the boost converter.

In some embodiments, the input voltage is a battery voltage Vbatt.

In some embodiments, the boost converter voltage converter is configured to receive the battery voltage Vbatt and generate a boosted voltage.

In some embodiments, the boosted voltage is configured as a supply voltage for one or more high-voltage (HV) power amplifiers (PAs).

In some embodiments, the bypass core is configured to provide the battery voltage Vbatt as an output of the boost converter.

In some embodiments, the bypass core is further configured to provide the buck voltage from the buck converter as an output of the boost converter.

In some embodiments, the voltage supply system further includes a controller configured to facilitate operation of the boost converter.

In some embodiments, the boost converter includes first and second switches configured to allow switched mode operations.

In some embodiments, the routing circuit includes a routing switch between the first output node and the second output node, the routing switch configured to be controlled by the controller.

In some implementations, the present disclosure relates to a radio-frequency (RF) module. The RF module includes a packaging substrate configured to receive a plurality of components. The RF module also includes a power amplification system implemented on the packaging substrate, the power amplification system including a voltage supply system, the voltage supply system including a boost converter having a bypass core, the voltage system further including a buck converter configured to receive an input voltage and generate a buck voltage, the voltage system further including a routing circuit configured to provide the buck voltage as an input to the boost converter.

In some embodiments, the RF module is a front-end module (FEM).

In some embodiments, the input voltage is a battery voltage Vbatt.

In some embodiments, the boost converter voltage converter is configured to receive the battery voltage Vbatt and generate a boosted voltage.

In some embodiments, the boosted voltage is configured as a supply voltage for one or more high-voltage (HV) power amplifiers (PAs).

In some embodiments, the bypass core is configured to provide the battery voltage Vbatt as an output of the boost converter.

In some embodiments, the bypass core is further configured to provide the buck voltage from the buck converter as an output of the boost converter.

In some embodiments, the RF module further includes a controller configured to facilitate operation of the boost converter.

In some embodiments, the boost converter includes first and second switches configured to allow switched mode operations.

In some embodiments, the routing circuit includes a routing switch between the first output node and the second output node, the routing switch configured to be controlled by the controller.

In some implementations, the present disclosure relates to a wireless device. The wireless device includes a transceiver configured to generate a radio-frequency (RF) signal. The wireless device also includes a front-end module (FEM) in communication with the transceiver, the FEM including a power amplification system configured to amplify the RF signal, the power amplification system including a voltage supply system, the voltage supply system including a boost converter having a bypass core, the voltage system further including a buck converter configured to receive an input voltage and generate a buck voltage, the voltage system further including a routing circuit configured to provide the buck voltage as an input to the boost converter. The wireless device further includes an antenna in communication with the FEM, the antenna configured to transmit the amplified RF signal.

In some embodiments, the input voltage is a battery voltage Vbatt.

In some embodiments, the boost converter voltage converter is configured to receive the battery voltage Vbatt and generate a boosted voltage.

In some embodiments, the boosted voltage is configured as a supply voltage for one or more high-voltage (HV) power amplifiers (PAs).

In some embodiments, the bypass core is configured to provide the battery voltage Vbatt as an output of the boost converter.

In some embodiments, the bypass core is further configured to provide the buck voltage from the buck converter as an output of the boost converter.

In some embodiments, the wireless device further includes a controller configured to facilitate operation of the boost converter.

In some embodiments, the boost converter includes first and second switches configured to allow switched mode operations.

In some embodiments, the routing circuit includes a routing switch between the first output node and the second output node, the routing switch configured to be controlled by the controller.

In some implementations, the present disclosure relates to method for operating a voltage supply system. The method includes generating a buck voltage from an input voltage. The method also includes providing the buck voltage as an input to a boost converter. The method further includes routing the buck voltage through the boost converter to yield an output voltage.

In some embodiments, the input voltage is a battery voltage.

In some embodiments, the buck voltage is less than the battery voltage.

In some embodiments, the routing of the buck voltage includes bypassing a boost functionality of the boost converter such that the output voltage is substantially equal to the buck voltage.

DETAILED DESCRIPTION OF SOME EMBODIMENTS

The headings provided herein, if any, are for convenience only and do not necessarily affect the scope or meaning of the claimed invention.

Figure 1:
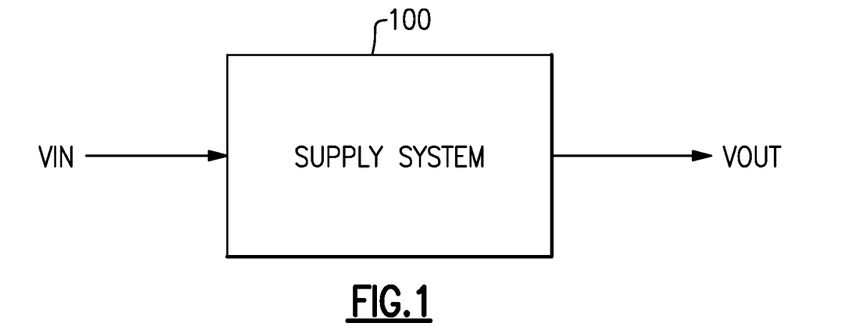
FIG. 1 is a block diagram illustrating a voltage supply system, according to some embodiments of the present disclosure.

FIG. 1 shows a block diagram of a voltage supply system 100 having one or more features as described herein. Such a system can generate one or more output voltages (e.g., Vout) based on an input voltage (Vin). For example, the supply system 100 may generate two output voltages, five output voltages, eight output voltages, etc., based on the input voltage Vin.

Figure 2:
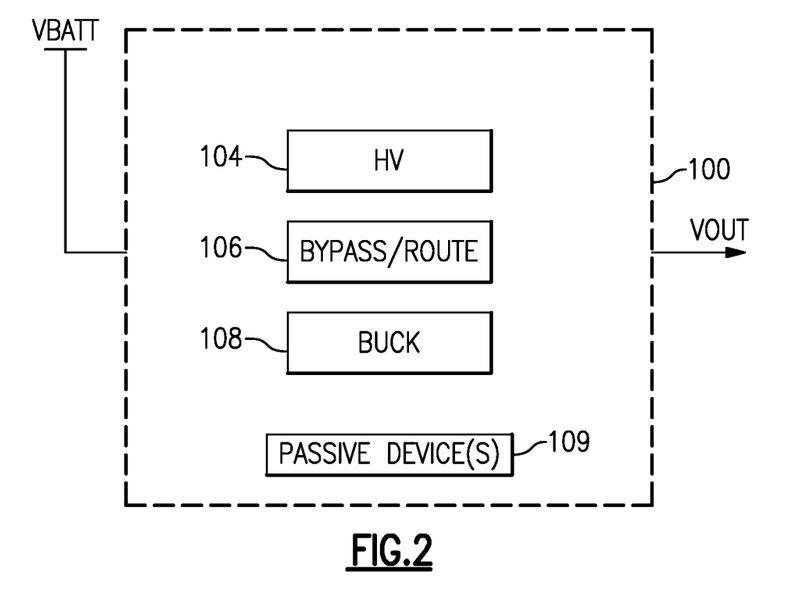
FIG. 2 is a block diagram illustrating a voltage supply system, according to some embodiments of the present disclosure.

FIG. 2 shows that in some embodiments, a voltage supply system 100 can include a high-voltage (HV) source 104, a buck source 108, and a bypass/route system 106 configured to provide one or more bypass/routing functionalities. The voltage supply system 100 can further include one or more passive devices 109 that can facilitate various functionalities associated with the HV source 104 and/or the buck source 108.

In the example of FIG. 2, the input voltage is indicated as being provided by a battery (voltage Vbatt). However, it will be understood that one or more features of the present disclosure can also be implemented in systems where the input is from a source other than a battery.

Figure 3:
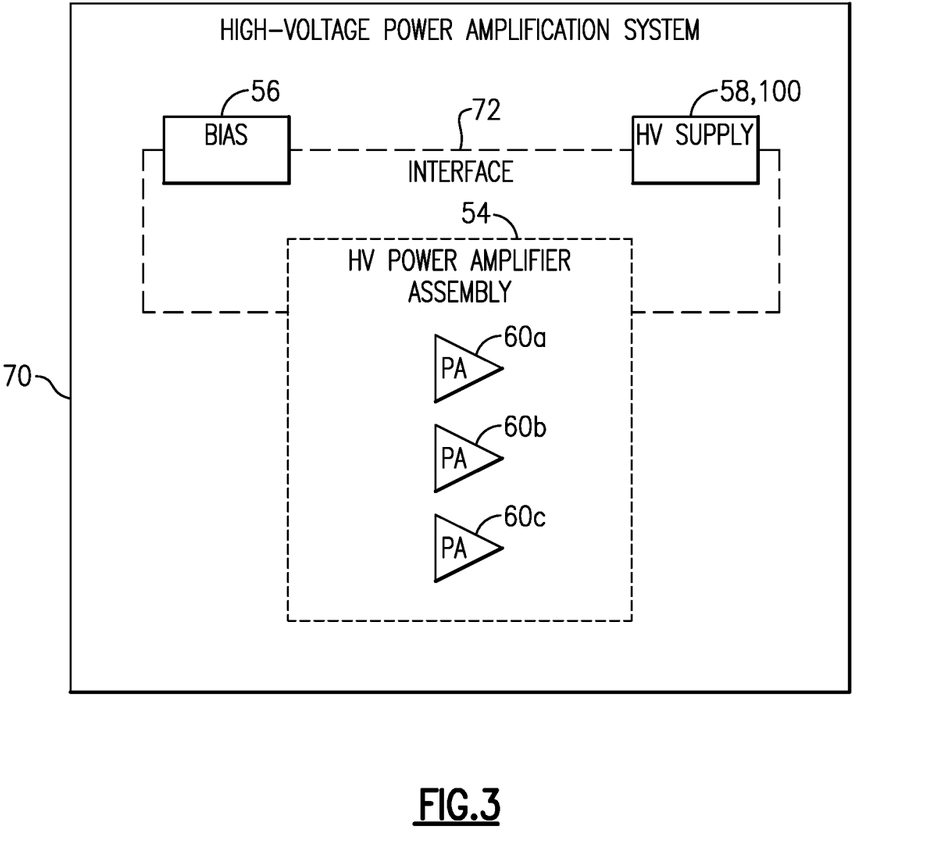
FIG. 3 is a block diagram illustrating a voltage supply system, according to some embodiments of the present disclosure.

FIG. 3 shows an example application in which the voltage supply system 100 of FIG. 1 can be implemented. In the example of FIG. 3, such a voltage system can include a high-voltage (HV) supply system 58 (also referred to herein as 100) configured to provide a plurality of supply voltage signals for an HV power amplification system 70.

In the example of FIG. 3, the HV power amplification system 70 can include a power amplifier assembly 54 having one or more power amplifiers (PAs) (e.g., 60a-60c). Some or all of such PAs can be configured to operate in an HV mode.

Referring to FIG. 3, the HV power amplification system 70 can further include a bias system 56. Such a system can be configured to provide bias signals to the power amplifier assembly 54 for operation of the PA(s).

Also referring to FIG. 3, the HV power amplification system 70 can further include an interface 72 between the power amplifier assembly 54 and either or both of the bias system 56 and the HV supply system 100. In some embodiments, such an interface can also provide interfacing functionality between the HV power amplification system 70 and an external system (not shown).

Many circuits in portable devices such as wireless devices require or utilize DC/DC power conversion to efficiently utilize limited battery supply resources. Often, voltages that exceed a battery voltage are needed or desired, while in other situations, voltages that are significantly less than the battery voltage are utilized. Circuits, devices, components, and/or modules may be used to convert a battery voltage to a desired voltage (e.g., to a higher voltage or a lower voltage). For example, a buck-boost converter may be used to convert a battery voltage to a higher and/or lower voltage. However, a buck-boost converter may increase the cost of a wireless device and may result in less efficient performance. In addition, some wireless devices may include PAs that may have a boost converter that is incompatible with lower voltage PAs. An additional buck converter may be used to generate the voltage used by the lower voltage PAs. This may also increase the cost of a wireless device and may result in less efficient performance.

Described herein are examples related to a supply system that, among others, includes a boost converter having a bypass core, a buck converter, and a routing circuit. The buck converter may generate a buck voltage based on an input voltage. The routing circuit may be configured to provide the input voltage or the buck voltage as an input of the boost converter. The bypass core may provide the buck voltage from the buck converter as an output of the boost converter.

Figure 4:
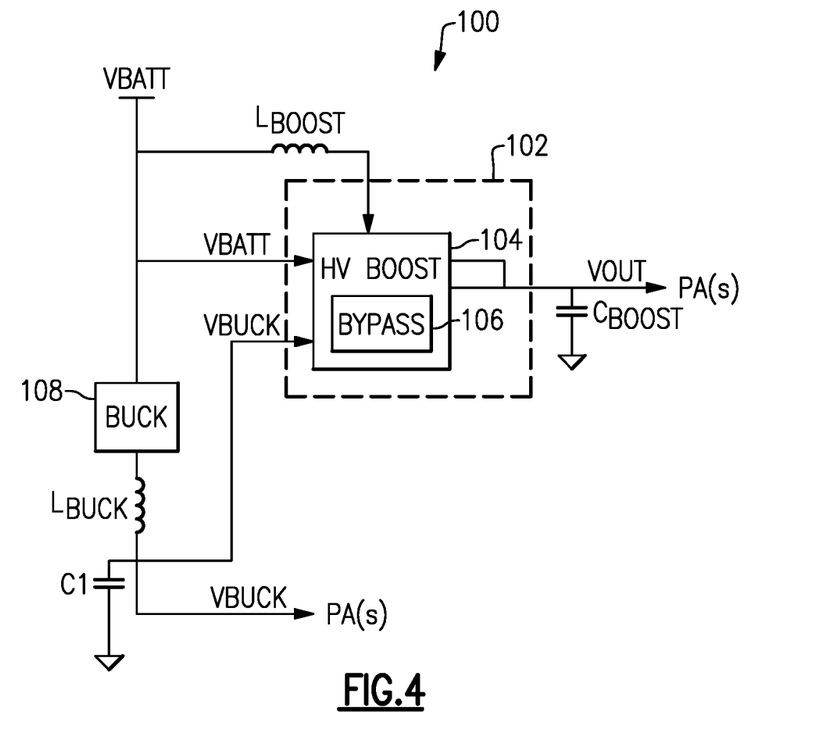
FIG. 4 is a diagram illustrating an example voltage supply system, according to some embodiments of the present disclosure.

FIG. 4 shows a more specific example of the voltage supply system 100 of FIG. 2. In the example of FIG. 4, a voltage supply system 100 is shown to include a supply device 102 (e.g., a die or a module) coupled to a battery voltage Vbatt as an input. The supply device 102 can include a high-voltage (HV) boost converter 104 coupled to Vbatt through a boost inductance $L_{Boost}$. In some embodiments, the boost inductance $L_{Boost}$ can be an inductor external to the supply device 102.

In some embodiments, the HV boost converter 104 can include a bypass core 106. Examples related to such a bypass core are described herein in greater detail.

The HV boost converter 104 is shown to generate an output voltage Vout, and such an output can be provided to, for example, one or more power amplifiers (PAs) such as high-voltage (HV) PA(s) as a supply voltage. Such an HV PA can include, for example, an HV average power tracking (APT) PA.

In the example of FIG. 4, the HV boost converter 104 can operate with an output capacitance $C_{Boost}$ and a feedback loop to maintain the output voltage Vout at or close to a set value. In some embodiments, the output capacitance $C_{Boost}$ can be a capacitor external to the supply device 102. Additional details of the HV boost converter 104 are described herein in reference to FIG. 6.

In the example of FIG. 4, the voltage supply system 100 can further include a buck converter 108 configured to receive Vbatt as an input and generate an output voltage VBuck through a buck inductance $L_{Buck}$. Such an output voltage VBuck can be provided to one or more PAs.

The output voltage VBuck from the buck converter 108 is also shown to be provided to the HV boost converter 104 as an input. Accordingly, the HV boost converter can operate in a boost mode based on an input of Vbatt through $L_{Boost}$, to generate, for example, an HV output, in a bypass mode in which an input of Vbatt is provided as an un-converted voltage output, or a buck-input mode in which the output VBuck of the buck converter 108 can be bypassed through or be further converted by the HV boost converter 104.

It is noted that in some applications, a high-voltage supply such as the HV boost converter 104 may not be efficient for generating low-voltage outputs which may be needed for some PAs in some front-end architectures. A buck DC-Dc converter such as the buck converter 108 of FIG. 4 typically provides a relatively efficient way of generating such low-voltage outputs. Such low-voltage outputs can be utilized for PAs operating at, for example, about 3V.

As described herein, the HV boost converter 104 can already include a bypass capability. Accordingly, routing the buck output voltage VBuck through such a bypass in the HV boost converter 104 can provide flexibility in design.

In the example of FIG. 4, the buck converter 108 is depicted as being external to the supply device 102 in which some or all of the HV boost converter 104 resides. In some embodiments, such a buck converter can also be implemented on the same supply device (e.g., a die or a module).

Figure 5:
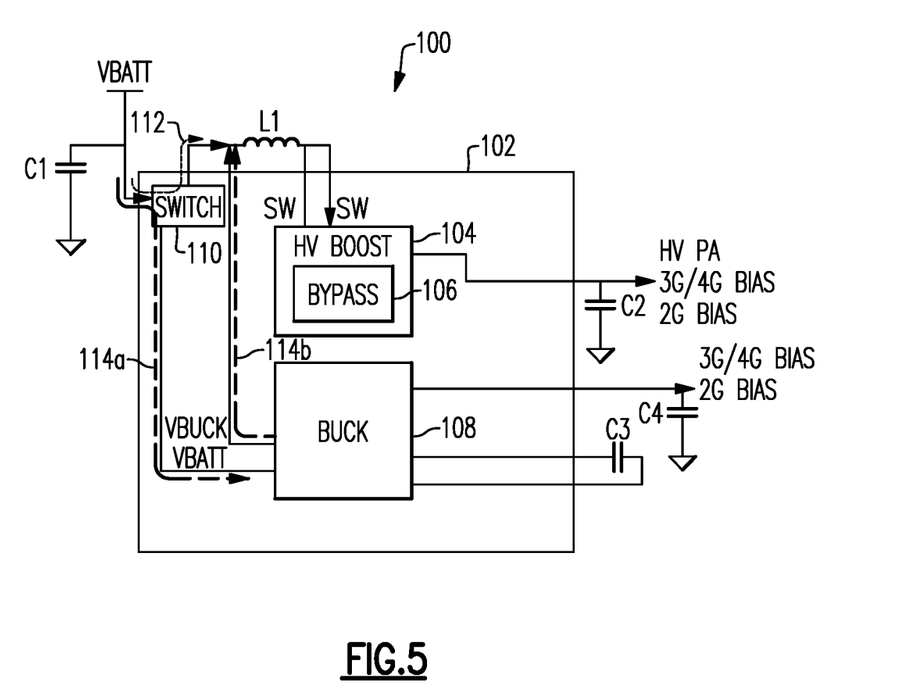
FIG. 5 is a diagram illustrating an example configuration of a voltage supply system in which a buck converter is part of a supply device, according to some embodiments of the present disclosure.

FIG. 5 shows an example configuration of a voltage supply system 100 in which a buck converter 108 is part of a supply device 102. In the example of FIG. 5, operation of the buck converter 108 and an HV boost converter 104, as well as a bypass circuit 106, can be similar to the example of FIG. 4. In the example of FIG. 5, however, routing of Vbatt to the buck converter 108 and the HV boost converter 104 is shown to be performed within the supply device (e.g., through a switch 110). Accordingly, a route 114*a* indicates an example of how Vbatt can be provided to the buck converter 108 from the battery source, and a route 114*b* indicates an example of how VBuck can be provided from the buck converter 108 to the HV boost converter 104. Similarly, a route 112 indicates an example of how Vbatt can be provided to the HV boost converter 104 from the battery source.

Figure 6:
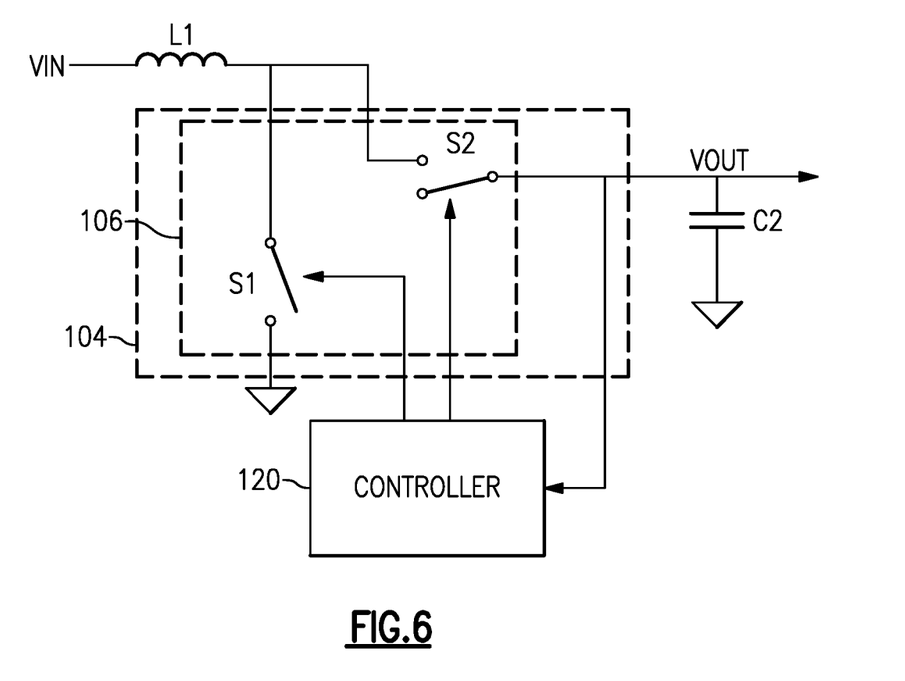
FIG. 6 is a diagram illustrating an example HV boost converter that includes a bypass, according to some embodiments of the present disclosure.

FIG. 6 shows an example of the HV boost converter 104 and how the bypass 106 can be implemented therein. The HV boost converter 104 is indicated as 104 for the purpose of generally depicting that such a portion of the HV boost converter can reside on a supply device (e.g., 102 in FIG. 4). It will be understood, however, that the HV boost converter can include the boost inductor (L1) and the boost capacitor (C2).

The HV boost converter 104 is shown to include first and second switches S1, S2 that can be operated under the control of a controller 120 so as to accumulate/transfer energy among the boost inductor L1 and the boost capacitor C2 and generate a regulated output voltage Vout. Such regulation of the output voltage Vout can be facilitated by a feedback loop and the controller 120.

In the example of FIG. 6, the bypass core functionality of the HV boost converter 104 can be provided by the switches S1 and S2, collectively indicated as 106. When the voltage supply system is in an HV output mode, both of the switches S1 and S2 can be operated in sequence to generate the HV output voltage. When the voltage supply system 100 is in a bypass mode, the first switch S1 can be turned OFF, and the second switch S2 can be turned ON. In such a state, the input voltage (Vbatt or VBuck) can be provided directly to the output node as Vout≈Vbatt or Vout≈VBuck.

Figure 7:
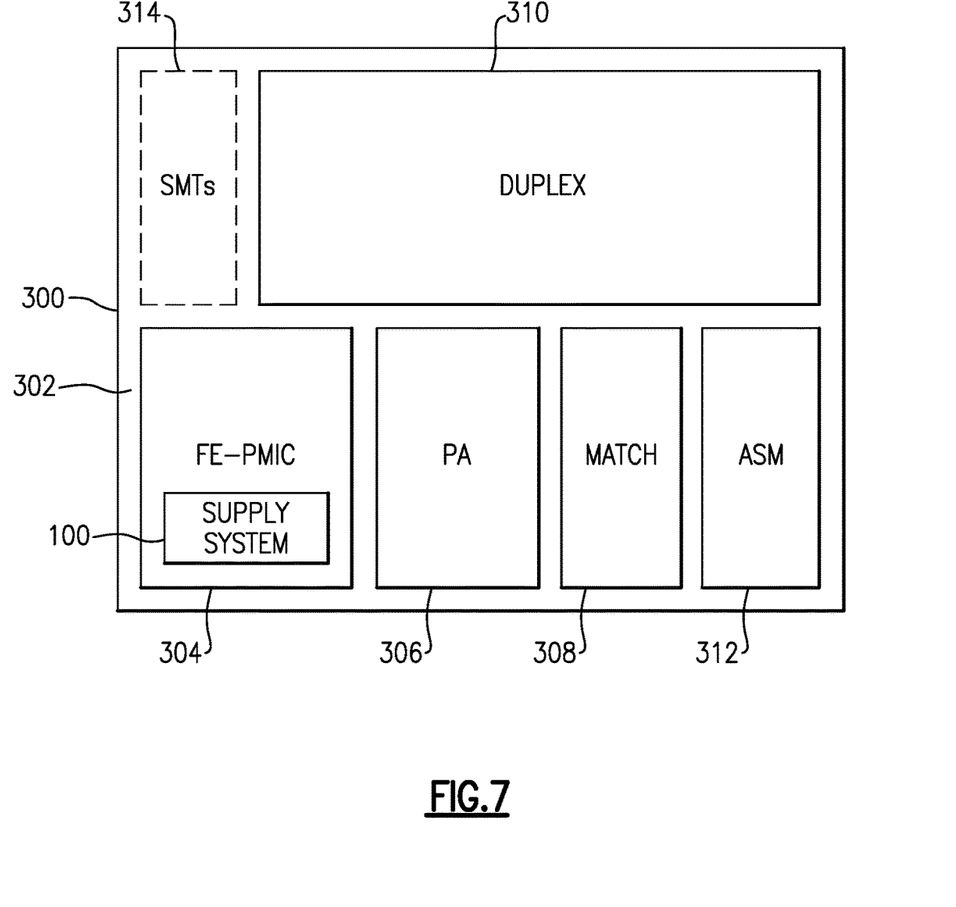
FIG. 7 is a diagram illustrating an example module, according to some embodiments of the present disclosure.

FIG. 7 shows that in some embodiments, some or all of the voltage supply system having one or more features as described herein (e.g., 100 in FIGS. 2-6) can be implemented in a module 300. Such a module can be, for example, a front-end module (FEM). In the example of FIG. 7, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s). In some embodiments, a voltage supply system 100 having one or more features as described herein can be implemented as a part of the FE-PMIC component 304.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
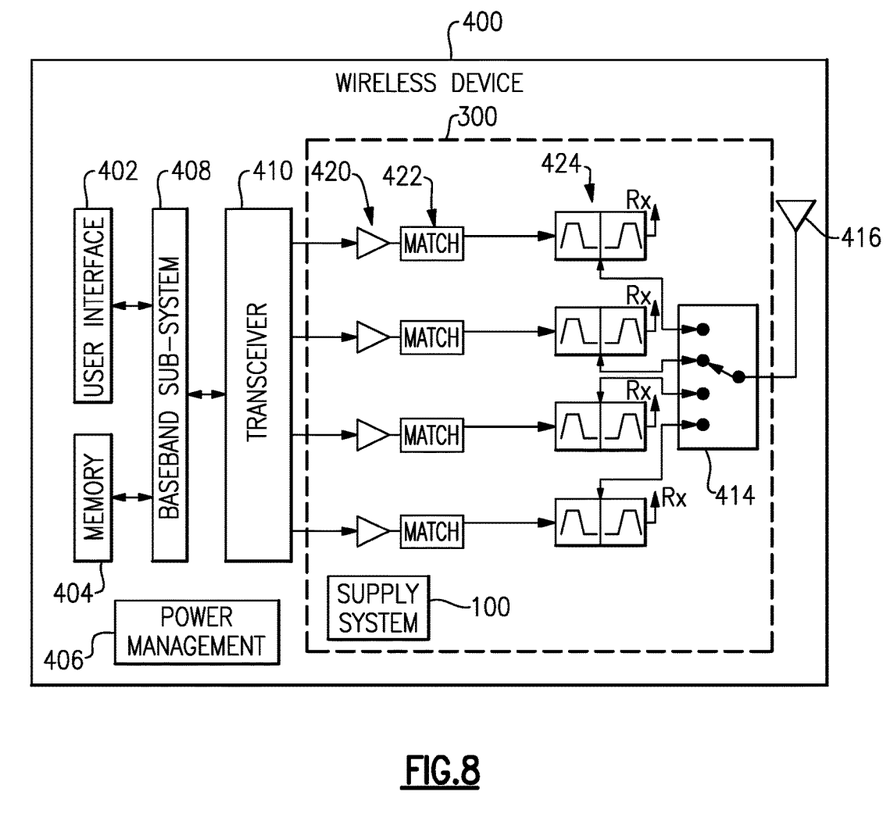
FIG. 8 is a diagram illustrating an example wireless device, according to some embodiments of the present disclosure.

FIG. 8 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 8, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 420. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 8, received signals are shown to be routed to "Rx" paths (not shown) that can include, for example, a low-noise amplifier (LNA).

In some embodiments, a voltage supply system 100 as described herein can be implemented as a part of the module 300.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 9:
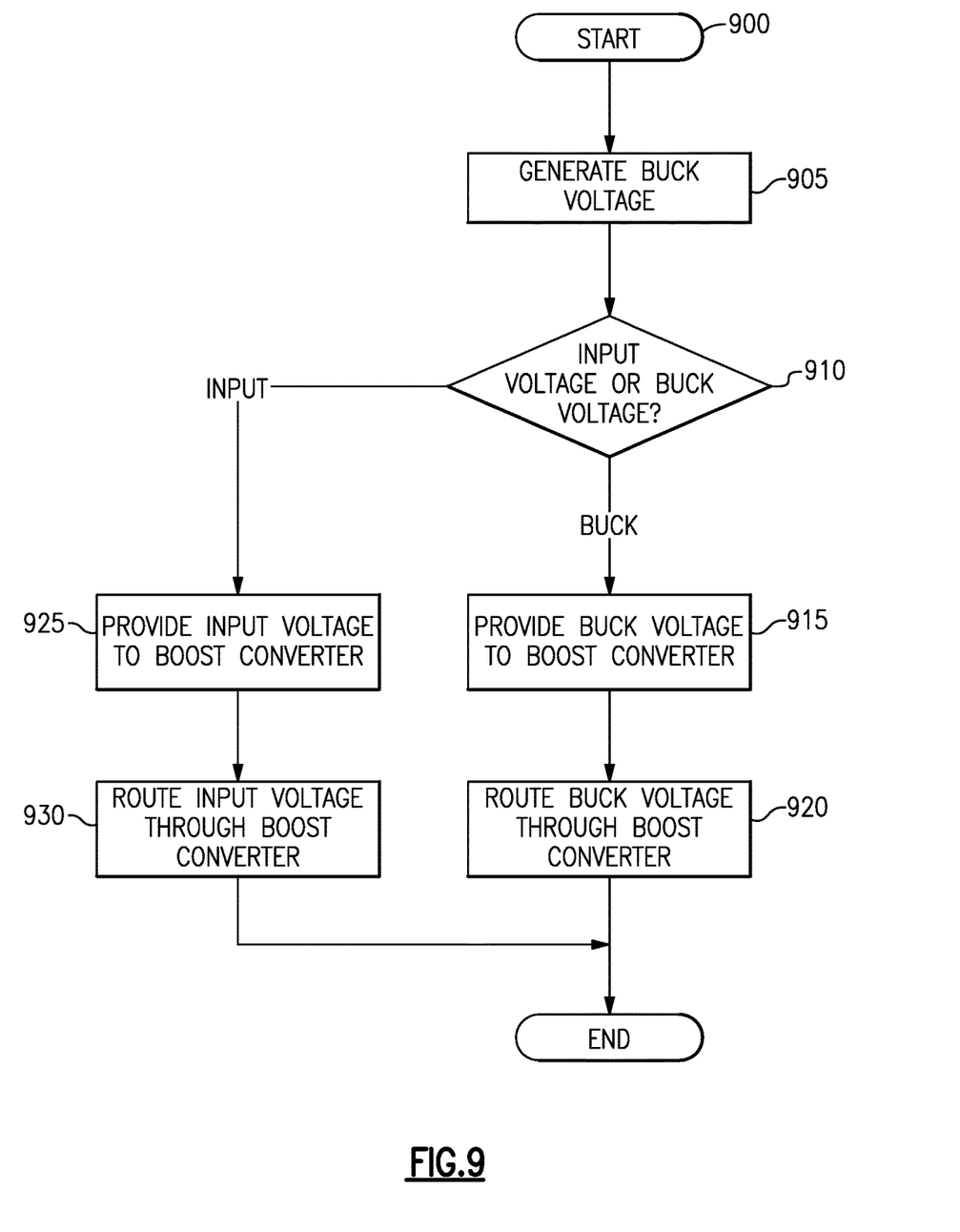
FIG. 9 is a flow diagram illustrating a process for operating a voltage supply system, according to some embodiments of the present disclosure.

FIG. 9 is a flow diagram illustrating a process 900 for operating a voltage supply system, according to some embodiments of the present disclosure. The process 900 may be performed by processing logic that comprises hardware (e.g., circuitry, dedicated logic, programmable logic, microcode, etc.), software (e.g., instructions run on a processor to perform hardware simulation), or a combination thereof. In one embodiment, process 900 may be performed by voltage supply system, as illustrated in FIGS. 1 through 6. For example, the process 900 may be performed by voltage supply system 100 illustrated in FIG. 4. In addition, the process 900 could alternatively be represented as a series of interrelated states via a state diagram or events.

The process 900 begins at block 905 where a buck voltage is generated based on an input voltage, as discussed above. For example, the buck voltage may be generated by a buck converter (e.g., buck converter 108 illustrated in FIGS. 2, 4, and 5) based on the input voltage (e.g., the buck converter may receive the input voltage, such as Vbatt, and may generate the buck voltage based on Vbatt). At block 910, the process 900 determines whether the input voltage should be used or the buck voltage should be used, as discussed above. For example, a controller (e.g., controller 120 illustrated in FIG. 6) may determine whether the input voltage or the buck voltage should be used.

If the buck voltage should be used, the process 900 may provide the buck voltage to the boost converter at block 915, as discussed above. At block 920, the process 900 may route the buck voltage through the boost converter, as discussed above. For example, referring to FIG. 6, the switches S1 and/or S2 may be configured to provide the buck voltage to the boost converter and/or route the buck voltage through the boost converter. After block 920, the process 900 ends. If the input voltage should be used, the process 900 may provide the input voltage to the boost converter at block 925, as discussed above. At block 930, the process 900 may route the input voltage through the boost converter, as discussed above. For example, referring to FIG. 6, the switches S1 and/or S2 may be configured to provide the input voltage to the boost converter and/or route the input voltage through the boost converter. After block 930, the process 900 ends.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts may be performed as a single step and/or phase. Also, certain steps and/or phases may be broken into additional sub-components to be performed separately. In some instances, the order of the steps and/or phases may be rearranged and certain steps and/or phases may be omitted entirely. Also, the methods described herein are to be understood to be open-ended, such that additional steps and/or phases to those shown and described herein may also be performed.

Although various embodiments and examples are disclosed above, inventive subject matter extends beyond the specifically disclosed embodiments to other alternative embodiments and/or uses and to modifications and equivalents thereof. Thus, the scope of the claims that may arise from this disclosure is not limited by any of the particular embodiments described above. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Some aspects of the systems and methods described herein may advantageously be implemented using, for example, computer software, hardware, firmware, or any combination of computer software, hardware, and firmware. Computer software may comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that may be implemented using software to be executed on a general purpose computer may also be implemented using a different combination of hardware, software, or firmware. For example, such a module may be implemented completely in hardware using a combination of integrated circuits. Alternatively or additionally, such a feature or function may be implemented completely or partially using specialized computers designed to perform the particular functions described herein rather than by general purpose computers.

Multiple distributed computing devices may be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that may direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations. Furthermore, the terms "first," "second," "third," "fourth," etc., as used herein are meant as labels to distinguish among different elements and may not necessarily have an ordinal meaning according to their numerical designation.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the disclosure provided herein may be applied to other methods and systems, and are not limited to the methods and systems described above, and elements and acts of the various embodiments described above may be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The teachings of the disclosure provided herein can be applied to other systems, not necessarily the system described above. The elements and acts of the various embodiments described above can be combined to provide further embodiments.

What is claimed is:

1. A voltage supply system comprising:
   a boost converter including a bypass core, the bypass core configured to provide a buck voltage as a first output of the boost converter;
   a buck converter configured to receive an input voltage and generate a buck voltage; and
   a routing circuit configured to provide the buck voltage as an input to the boost converter.

2. The voltage supply system of claim 1 wherein the input voltage is a battery voltage Vbatt.

3. The voltage supply system of claim 2 wherein the boost converter voltage converter is configured to receive the battery voltage Vbatt and generate a boosted voltage.

4. The voltage supply system of claim 3 wherein the boosted voltage is configured as a supply voltage for one or more high-voltage (HV) power amplifiers (PAs).

5. The voltage supply system of claim 4 wherein the bypass core is configured to provide the battery voltage Vbatt as a second output of the boost converter.

6. The voltage supply system of claim 1 further comprising a controller configured to facilitate operation of the boost converter.

7. The voltage supply system of claim 6 wherein the boost converter includes first and second switches configured to allow switched mode operations.

8. The voltage supply system of claim 7 wherein the routing circuit includes a routing switch between a first output node and a second output node, the routing switch configured to be controlled by the controller.

9. A radio-frequency (RF) module comprising:
a packaging substrate configured to receive a plurality of components; and
a power amplification system implemented on the packaging substrate, the power amplification system including a voltage supply system, the voltage supply system including a boost converter having a bypass core, the bypass core configured to provide a buck voltage as a first output of the boost converter, the voltage system further including a buck converter configured to receive an input voltage and generate a buck voltage, the voltage system further including a routing circuit configured to provide the buck voltage as an input to the boost converter.

10. The RF module of claim 9 wherein the RF module is a front-end module (FEM).

11. The RF module of claim 9 wherein the input voltage is a battery voltage Vbatt.

12. The RF module of claim 11 wherein the boost converter voltage converter is configured to receive the battery voltage Vbatt and generate a boosted voltage.

13. The RF module of claim 12 wherein the boosted voltage is configured as a supply voltage for one or more high-voltage (HV) power amplifiers (PAs).

14. The RF module of claim 13 wherein the bypass core is configured to provide the battery voltage Vbatt as a second output of the boost converter.

15. The RF module of claim 9 further comprising a controller configured to facilitate operation of the boost converter.

16. The RF module of claim 15 wherein the boost converter includes first and second switches configured to allow switched mode operations.

17. The RF module of claim 16 wherein the routing circuit includes a routing switch between a first output node and a second output node, the routing switch configured to be controlled by the controller.

18. A method for operating a voltage supply system, the method comprising:
generating a buck voltage from an input voltage;
providing the buck voltage as an input to a boost converter; and
routing the buck voltage through the boost converter to yield an output voltage, the routing including bypassing a boost functionality of the boost converter such that the output voltage is substantially equal to the buck voltage.

* * * * *